(12) United States Patent
Saito

(10) Patent No.: US 6,930,629 B1
(45) Date of Patent: Aug. 16, 2005

(54) ANALOG/DIGITAL CONVERTING APPARATUS

(75) Inventor: Hideki Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/947,365

(22) Filed: Sep. 23, 2004

(30) Foreign Application Priority Data

May 18, 2004 (JP) .............................. 2004-148093

(51) Int. Cl.[7] .............................................. H03M 1/12
(52) U.S. Cl. ...................................... 341/155; 341/141
(58) Field of Search ............................... 341/155, 141, 341/142

(56) References Cited

U.S. PATENT DOCUMENTS

| | | | |
|---|---|---|---|
| 5,181,520 A * | 1/1993 | Wertheim et al. ........... | 600/544 |
| 5,617,090 A * | 4/1997 | Ma et al. .................... | 341/141 |
| 5,691,719 A * | 11/1997 | Wakimoto .................. | 341/141 |
| 6,177,895 B1 * | 1/2001 | Vrancic et al. ............. | 341/132 |
| 6,473,701 B1 * | 10/2002 | Tallman et al. .............. | 702/67 |
| 6,816,102 B2 * | 11/2004 | Pavicic ....................... | 341/155 |
| 2002/0121998 A1 | 9/2002 | Yamazaki ................... | 341/155 |
| 2003/0164783 A1 * | 9/2003 | Ahn .......................... | 341/141 |

FOREIGN PATENT DOCUMENTS

| | | |
|---|---|---|
| JP | HEI 4-260915 | 9/1992 |
| JP | HEI 8-77133 | 3/1996 |
| JP | 2002-261609 | 9/2002 |

* cited by examiner

*Primary Examiner*—Michael Tokar
*Assistant Examiner*—Linh V. Nguyen
(74) *Attorney, Agent, or Firm*—Staas & Halsey LLP

(57) ABSTRACT

Upon detection of any abnormality in digital data of one of the input channels, it is possible to read, with reliability, digital data of all the remaining channels whose conversion is performed after conversion of the one channel. The apparatus includes: a comparing units which sequentially compares individual channels of digital data obtained by the analog/digital converter to thresholds associated, one with each of the channels; a digital data holding units which holds, if the comparing units detects that one of the channels of digital data exceeds its associated threshold, digital data of the one channel and also digital data of the remaining channels whose conversion is performed after conversion of the one channel; and a notifying units which externally outputs a signal notifying that the digital data of the one channel exceeds its associated threshold the moment the digital data holding units stores all the channels of digital data.

16 Claims, 5 Drawing Sheets

US 6,930,629 B1

ANALOG/DIGITAL CONVERTING APPARATUS

BACKGROUND OF THE INVENTION

1. Field of the Invention

The present invention relates to analog/digital converting apparatus that sequentially convert analog data input from external apparatus into digital form.

2. Description of the Related Art

There have been techniques for monitoring phenomena appearing as analog data (analog values)(for example, changes in temperature or in voltage), by use of an analog/digital converting apparatus (hereinafter will be called the "A/D converting apparatus").

FIG. 4 shows a construction of a monitoring system which employs a previous A/D converting apparatus. As shown in FIG. 4, the previous monitoring system 100 includes an A/D converting apparatus 101 and an operation controller 110 having a CPU (Central Processing Unit).

The A/D converting apparatus 101 includes: a multiplexer (MPX) 102 which selects one of the channels CH1 through CHn; (here, n is an integer equal to or greater than 4 in this example) of analog data input from external apparatus; an analog/digital converter (hereinafter will be called the "A/D converter"; designated as "ADC" in the drawings) 103 which converts analog data of the channel selected by the MPX 102 into digital form; and a digital conversion value holding units 104 which temporarily holds the post-conversion digital data obtained by the A/C converter 103.

The operation controller 110 controls the MPX 102 to select analog data of channels CH1 through CHn in sequence in a periodic manner, and the operation controller 110 also reads out digital data which has been sequentially converted by the A/D converter 103 and then stored in the digital conversion value holding units 104.

Further, the operation controller 110 has a comparing units 111 which compares digital data obtained from the digital conversion value holding units 104 to thresholds that are associated with the channels of the obtained digital data. If the comparing units 111 detects that digital data of a certain channel exceeds its associated threshold, the operation controller 110 judges that the analog data of the channel is abnormal. The operation controller 110 then reads out digital data of all the remaining channels, and analyzes the cause of the occurrence of the abnormality.

That is, if the comparing units 111 detects any abnormal digital data, the operation controller 110 controls the MPX 102 to obtain digital data of all the remaining channels, and then analyzes the cause of the abnormality.

FIG. 5 shows an application of the monitoring system 100 that employs the previous A/D converting apparatus 101 of FIG. 4. As shown in FIG. 5, when the monitoring system 100 monitors voltage supply and temperature for individual elements [here, a CPU 121 and an I/O (Input/Output) device 122, and so on] making up the system board 120 of a UNIX™ sever, the MPX 102 of the A/D converting apparatus 101 receives voltage data from DDCc123 and DDCi124, which are power supplies (here, DC—DC converters) supplying the CPU 121 and the I/O device 122 with direct current, and temperature data from THc125 and THi126, which are thermistors measuring the temperatures of the CPU 121 and the I/O device 122.

As is already described with reference to FIG. 4, the monitoring system 100 monitors voltage supplies and temperatures for individual elements of the system board 120 of the UNIX™ server. If any abnormality occurs, its cause is analyzed.

In the monitoring system 100 of FIG. 4, every time the digital conversion value holding units 104 stores digital data therein, the operation controller 110 obtains the digital data so that the comparing units 111 compares the digital data to thresholds, which causes so large a load on the comparing units 111.

In order to reduce the load on the operation controller (CPU), techniques are proposed in which a comparing units is installed in the A/D converting apparatus, and in which an interrupt signal is output to the operation controller only when the comparing units detects any abnormality in digital data (for example, the following patent applications 1 and 2).

Further, another technique is also proposed in which a comparing units is prepared in the A/D converting apparatus. When the digital data is of a specific value, the processing on the A/D converting apparatus is switched into a processing mode corresponding to the specific value (for example, the following patent application 3).

[Patent application 1] Japanese Patent Publication No. 2002-261609

[Patent application 2] Japanese Patent Publication No. HEI 4-260915

[Patent application3] Japanese Patent Publication No. HEI 8-77133

In the monitoring system 100 employing above-described the previous A/D converting apparatus 101, if any abnormality is detected in digital data of one of the channels CH1 through CHn, the operation controller 110 uses digital data of the one channel and digital data of all the remaining channels, to analyze the cause of the occurrence of the abnormality. At that time, for attaining accurate analysis of the cause of the abnormality by units of the operation controller 110, it is preferred that not only the digital data of the one channel but also digital data of the remaining channels whose conversion is performed immediately after the conversion of the one channel is used in the analysis.

However, in the A/D converting apparatus 101 of FIG. 4, under a condition where the operation controller 110 performs other processing than the processing relating to the A/D converting apparatus 101, such other processing can make it impossible to read all the digital data necessary for the analysis from the A/D converting apparatus 101, even though the comparing units 111 detects any abnormality in digital data of one channel.

In addition, in the A/D converting apparatus 101, in order for the operation controller 110 to read all the other data necessary for the analysis, the operation controller 110 needs to control the MPX 102 to select the individual channels one by one to convert the data into digital form, and to read the digital data stored in the digital conversion value holding units 104 piece by piece. Because of this, it takes a long time to read all the other digital data even when the operation controller 110 can concentrate on the operation as the monitoring system 100 with no necessity for the operation controller 110 to perform any other processing.

In the techniques disclosed in the above patent applications 1 through 3, also, the operation controller halts the processing currently performed, upon receipt of an interrupt signal from the A/D converting apparatus, and obtains all the other digital data piece by piece, so that it takes a long time to complete the reading of the digital data. Further, in view of other processing to be performed, it can sometimes be impossible to read the required digital data without delay, thereby making it also impossible to read, with reliability, the digital data of all the other channels whose conversion is performed immediately after conversion of the one channel in which abnormality is detected.

In this manner, the aforementioned previous A/D converting apparatus has the following problem: even if any abnormality is detected in one channel of digital data, it is impossible to read out, with reliability, digital data of all the remaining channels whose conversion is performed after conversion of the one channel.

SUMMARY OF THE INVENTION

With the foregoing problems in view, it is an object of the present invention to provide analog/digital converting apparatus in which, upon detection of any abnormality in digital data of one of the input channels, it is possible to read out, with reliability, digital data of all the remaining channels whose conversion is performed immediately after conversion of the one channel.

In order to accomplish the above object, according to the present invention, there is provided an analog/digital converting apparatus, comprising: an analog/digital converter which converts in sequence a plurality of channels of analog data, which is externally input to the apparatus, into a plurality of channels of digital data; a comparing units which compares, in sequence, the individual channels of digital data obtained by the analog/digital converter to thresholds associated, one with each of the channels; a digital data holding units which holds, if the comparing units detects that one of the channels of digital data exceeds its associated threshold, digital data of the one channel and also digital data of the remaining channels whose conversion is performed after conversion of the one channel; and a notifying units which externally outputs a signal notifying that the digital data of the one channel exceeds its associated threshold the moment when the digital data holding units holds all the channels of digital data.

As a generic feature, there is provided an analog/digital converting apparatus, comprising: an analog/digital converter which converts in sequence a plurality of channels of analog data, which is externally input to the apparatus, into a plurality of channels of digital data; a comparing units which compares, in sequence, the individual channels of digital data obtained by the analog/digital converter to thresholds associated, one with each of the channels; a digital data holding units which holds, if the comparing units detects that one of the channels of digital data consecutively exceeds its associated threshold a predetermined number (n) of times, digital data of the one channel obtained by the nth conversion and also digital data of the remaining channels whose conversion is performed after the nth conversion of the one channel; and a notifying units which externally outputs a signal notifying that the digital data of the one channel exceeds its associated threshold the moment when the digital data holding units holds all the channels of digital data.

As a preferred feature, the analog/digital converting apparatus further comprises a threshold holding units which holds the threshold for each of the channels, and the comparing units compares the plurality of channels of digital data obtained by the analog/digital converter to the thresholds of the individual channels of digital data held in the threshold holding units.

As another preferred feature, the digital data holding units holds the digital data of the one channel and also the digital data of the remaining channels until the notifying units externally receives an instruction to clear the output of the signal.

As still another preferred feature, the digital data holding units holds the digital data for each of the channels separately.

The analog/digital converting apparatus of the present invention guarantees the following advantageous results. According to the analog/digital converting apparatus of the present invention, when the notifying units externally outputs a signal notifying that some digital data exceeds its threshold, the digital data holding units holds all the digital data required to analyze the cause of the threshold excess. As a result, an external device that is connected to the analog/digital converting apparatus to perform such analysis is capable of reading necessary digital data stored in the digital data holding units with reliability.

Further, the digital data holding units holds digital data of one channel in which threshold excess occurs and also digital data of the remaining channels which is obtained after conversion of the one channel, until the notifying units externally receives an instruction to clear the signal output. This makes it possible to read out digital data of the one channel and digital data of all the remaining channels whose conversion is performed immediately after the occurrence of the threshold excess in the one channel, regardless of the timing with which the external device reads out the digital data stored in the digital data holding units.

Other objects and further features of the present invention will be apparent from the following detailed description when read in conjunction with the accompanying drawings.

DESCRIPTION OF THE PREFERRED EMBODIMENT(S)

Embodiments of the present invention will be described hereinbelow with reference to the relevant accompanying drawings.

[1] First Embodiment

Figure 1:
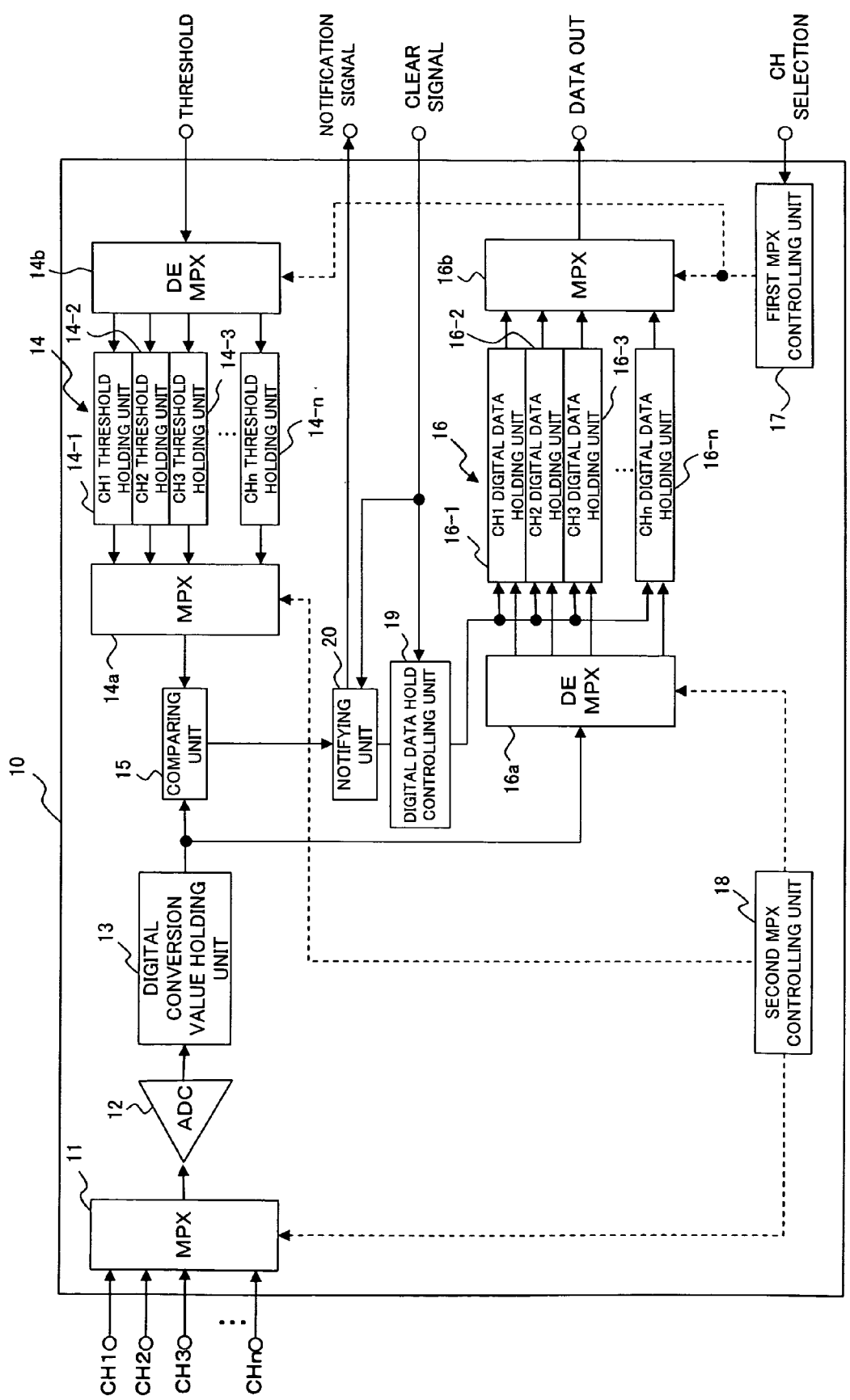
FIG. 1 is a block diagram showing a construction of an A/D (analog/digital) converting apparatus according to a first embodiment of the present invention.

A description will now be made of a first embodiment of the present invention. FIG. 1 shows a construction of an analog/digital converting apparatus (hereinafter will be called the "A/D converting apparatus"). As shown in FIG. 1, the A/D converting apparatus 10 of the first embodiment has a multiplexer (MPX) 11, analog/digital converter (ADC; hereinafter will be called the "A/D converter") 12, digital conversion value holding units 13, threshold holding units 14, multiplexer (MPX) 14a, demultiplexer (DEMPX) 14b, comparing units 15, demultiplexer (DEMPX) 16a, multiplexer (MPX) 16b, first multiplexer (MPX) controlling unit 17, second multiplexer (MPX) controlling unit 18, digital data hold controlling unit 19, and notifying units 20.

The first MPX control unit 17 controls the DEMPX 14b and the MPX 16b (detailed later) in accordance with an instruction given from an external apparatus, and the second MPX controlling unit 18 controls the MPXs 11 and 14a and the DEMPX 16a (described later). Further, in the A/D converting apparatus 10 of the first embodiment, the MPXs 11 and 14a and the DEMPX 16a are controlled by the second MPX controlling unit 18 to periodically select channels in an automatic way.

The MPX 11 is controlled by the second MPX controlling unit 18 to select analog data of one of the channels CH1 through CHn (here, n is an integer equal to or greater than 4) and to output the selected analog data to the A/D converter 12.

The A/D converter 12 converts the analog data, which is input from the MPX 11, into digital data.

The digital conversion value holding units 13 temporarily holds the digital data which has thus been converted by the A/D converter 12.

The threshold holding units 14, which holds thresholds for the individual channels CH1 through CHn, has CH1 threshold holding unit 14-1, CH2 threshold holding unit 14-2, . . . , and CHn threshold holding unit 14-n, which are associated with the channel CH1, CH2, . . . , and CHn, respectively.

The MPX 14a is controlled by the second MPX controlling unit 18 to select one of the thresholds held, one in each of the CH1 threshold holding units 14-1 through the CHn threshold holding units 14-n, and sends the selected threshold to the comparing units 15 (detailed later).

The DEMPX 14b is controlled by the first MPX control unit 17 to distribute thresholds input from an external apparatus among threshold holding units 14-1 through 14-n, for the purpose of setting or changing the thresholds held in the CH1 threshold holding units 14-1 through the CHn threshold holding units 14-n.

The comparing units 15 compares digital data held in the digital conversion value holding units 13 to a threshold associated with the channel of digital data which is selected by the MPX 14a and output from the threshold holding units 14.

The digital data holding units 16, which holds digital data obtained by the A/D converter 12 for each channel, CH1 through CHn, has a CH1 digital data holding unit 16-1 through a CHn digital data holding unit 16-n which are associated with the individual channels CH1 through CHn, respectively.

The DEMPX 16a distributes the digital data, under control by the second MPX controlling unit 18, to the digital data holding units 16-1 through 16-n in accordance with the channels of the data, to store the data therein.

The MPX 16b is controlled by the first MPX control unit 17 to select channels of digital data to be externally output, from among the CH1 digital data holding unit 16-1 through the CHn digital data holding unit 16-n.

The digital data hold controlling unit 19 controls the digital data holding units 16 in such a manner that, upon detection by the comparing units 15 that digital data of any one of the channels CH1 through CHn exceeds its threshold, the digital data holding units 16 holds digital data of this channel and also digital data of the remaining channels whose conversion if performed by the A/D converter 12 after conversion of the above channel.

The notifying units 20, upon detection by the comparing units 15 that digital data of any one of the channels CH1 through CHn exceeds its threshold, externally outputs a notification signal (interrupt signal), notifying to that effect, to an external apparatus [for example, an operation controller (CPU: Central Processing Unit)]. Here, as will be detailed later with reference to FIG. 2, the digital data holding units 16 externally outputs such a notification signal the instant when the digital data holding units 16 receives and stores whole the digital data therein.

The notifying units 20 controls the digital data holding units 16 to keep holding the digital data of the aforementioned one channel and also the digital data of the remaining channels whose conversion is performed by the A/D converter 12 after conversion of the one channel, while the notifying units 20 is outputting the notification signal (that is, until a clear signal is received from an external apparatus).

That is, upon detection by the comparing units 15 that a channel of digital data exceeds its threshold, the digital data holding units 16 holds digital data of this channel and also digital data of the remaining channels whose conversion is performed after conversion of the above channel, until a notification signal output by the notifying units 20 is cleared [that is, until the notifying units 20 externally receives an instruction (clear signal) to clear the output of the notification signal].

Figure 2:
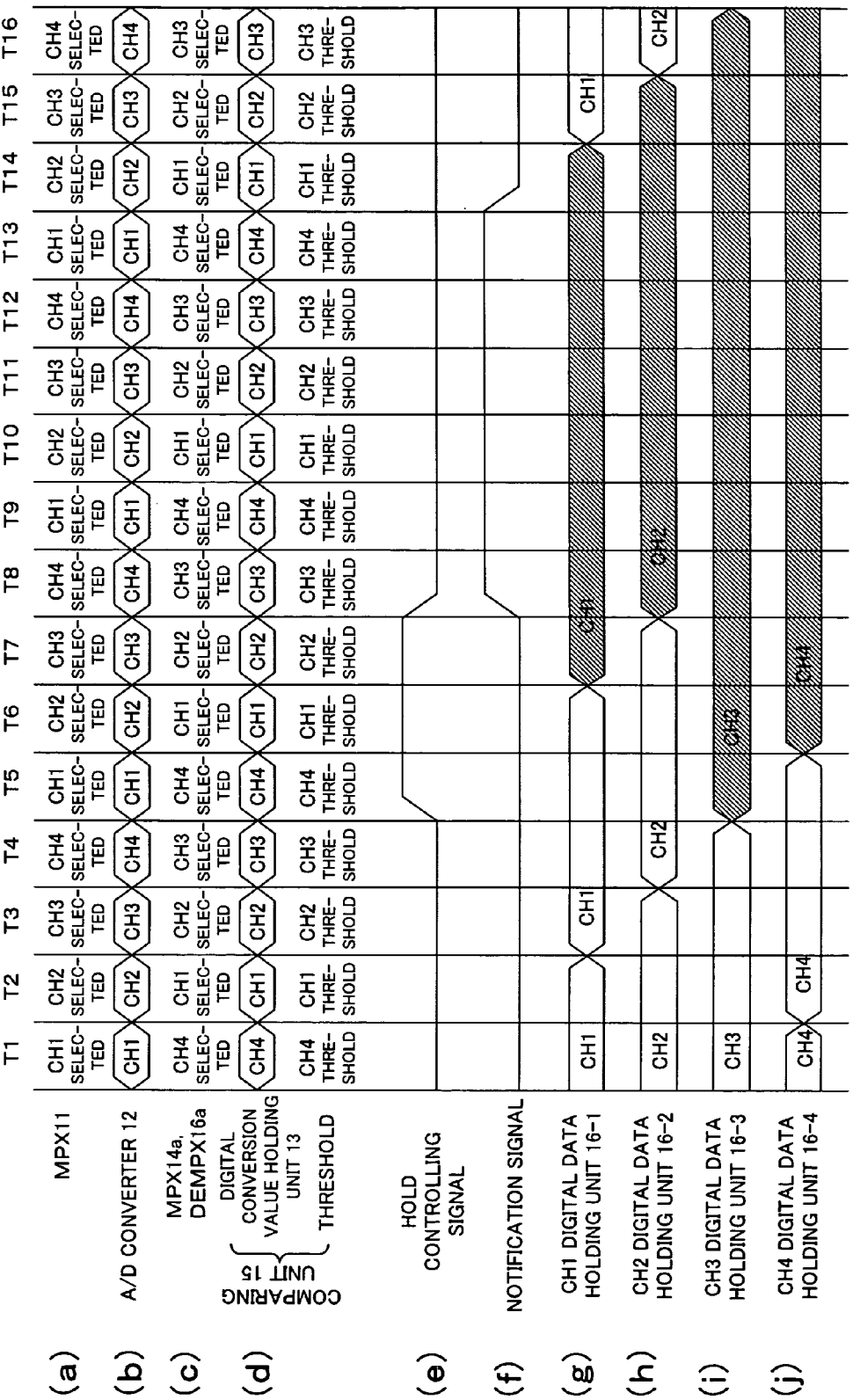
FIG. 2 is a timing chart for use in describing an operation of the A/D converting apparatus of the first embodiment of the present invention.

Next, a description will be made hereinbelow of an operation of the A/D converting apparatus 10 of the first embodiment. FIG. 2, (a) through (j), shows a timing chart for use in describing the operation of the A/D converting apparatus 10 of the first embodiment. In this example, channels CH1 through CH4 (n=4) are externally input, and T1 through T16 indicate processing time units (control cycles) used in the A/D converting apparatus 10.

As shown in FIG. 2, (a) through (j), in the A/D converting apparatus 10, under control by the second MPX controlling unit 18, the MPX 11 selects analog data, which is input from external apparatus, of channels CH1 through CH 4 in sequence in a periodic manner [see FIG. 2(a)]. The A/D converter 12 then sequentially converts the analog data of the individual channels selected by the MPX 11 into digital form [see FIG. 2(b)].

At this time, the MPX 14a is controlled by the second MPX controlling unit 18 to select channels that are shifted in time by one channel with respect to the channels selected by the MPX 11. For instance, assuming that the MPX 11 sequentially selects analog data of channels CH1, CH2, CH3, and CH4, in this order, the MPX 14a sequentially selects the individual threshold holding units of the threshold holding units 14 in the order named: the CH4 threshold holding units 14-4; the CH1 threshold holding units 14-1; the CH2 threshold holding units 14-2; the CH3 threshold holding units 14-3.

Further, as in the case of the MPX 14a, the DEMPX 16a is also controlled by the second MPX controlling unit 18 to select channels that are shifted in time by one channel with respect to the channels selected by the MPX 11 [see FIG. 2(C)]. The post-conversion digital data stored in the digital conversion value holding units 13 is hereby distributed to the digital data holding units 16-1 through 16-4 associated with the respective channels of the digital data.

After that, the comparing units 15 compares the post-conversion digital data held in the digital conversion value holding units 13 to the threshold held in the threshold holding units 14 selected by the MPX 14a [see FIG. 2(d)].

More precisely, after the MPX 11 selects channel CH1 [see T1 of FIG. 2(a)], the A/D converter 12 converts analog data of channel CH1 into digital form [see T1 of FIG. 2(b)], and the converted digital data is stored in the digital conversion value holding units 13 in the next timing (processing time unit) [see T2 of FIG. 2(d)].

Further, since the MPX 14a selects the CH1 threshold holding units 14-1 with the same timing that the post-conversion digital data is stored in the digital conversion value holding units 13 [see T2 of FIG. 2(c)], the comparing units 15 receives digital data of channel CH1 and its associated threshold to compare therebetween [see T2 of FIG. 2(d)].

In addition, with the same timing, the DEMPX 16a also selects the CH1 digital data holding unit 16-1 for CH1 [see T2 of FIG. 2(c)], and the digital data of CH1 is then stored in the CH1 digital data holding unit 16-1 in the next timing [see T3 of FIG. 2(g)].

After that, the comparing units 15 repeats the foregoing normal operations for the individual channels in sequence, unless any threshold excess is detected.

Here, if the comparing units 15 detects that digital data of channel CH 3 exceeds its threshold [see T4 of FIG. 2(d)], the digital data hold controlling unit 19 asserts a hold controlling signal [see T5 of FIG. 2(e)] to instruct the digital data holding units 16 to hold the digital data of channel CH3 stored therein and also digital data of the other channels which undergoes conversion after channel CH3 conversion, and is newly stored in the digital data holding units 16, with no data updating performed. After counting n−1 (here, after counting 3, because n=4), the hold controlling signal is negated [see T8 of FIG. 2(e)].

Upon the negation of the hold control signal, the notifying units 20 outputs a notification signal externally notifying that the digital data of channel CH3 exceeds the threshold [see T8 of FIG. 2(f)], and keeps sending this notification signal until an instruction to clear this notification signal is externally received [see T14 of FIG. 2(f)]. That is, the notifying units 20 outputs the notification signal with the same timing that the digital data holding units 16 stores the last channel (here, channel CH2) in a conversion cycle which begins from the channel (here, channel CH3) that reveals the occurrence of threshold excess.

While the notifying units 20 is outputting the notification signal [see T8 through T14 of FIG. 2(f)], the digital data holding units 16 keeps holding digital data of channel CH3, which exceeds the threshold, and also digital data of the remaining channels which is converted after channel CH3 conversion and is newly stored in the digital data holding units 16 [see T8 through T14 of FIG. 2, (g) though (j)]. Here, after clearance of the notification signal output by the notifying units 20, the foregoing normal operations are performed (see T15 and T16 of FIG. 2).

In this manner, the digital data holding units 16 keeps holding the digital data of channel CH3, which exceeds the threshold, and also the digital data of the remaining channels which is converted after completion of channel CH3 conversion and is newly stored in the digital data holding units 16 [see diagonally shaded areas in FIG. 2, (g) through (j)], during the time from the assertion of the hold controlling signal by the digital data hold controlling unit 19 till the clearance of output of the notification signals by the notifying units 20 [that is, until the notifying units 20 externally receives an instruction (clear signal) to clear the output of the notification signal] (see T5 through T14 of FIG. 2).

In the A/D converting apparatus 10 of the first embodiment, even if the comparing units 15 detects threshold excess in any other channel than channel CH3 during the time after assertion of the hold controlling signal by the digital data hold controlling unit 19 till clearance of the notification signal by the notifying units 20, such threshold excess is ignored and not accepted.

Figure 4:
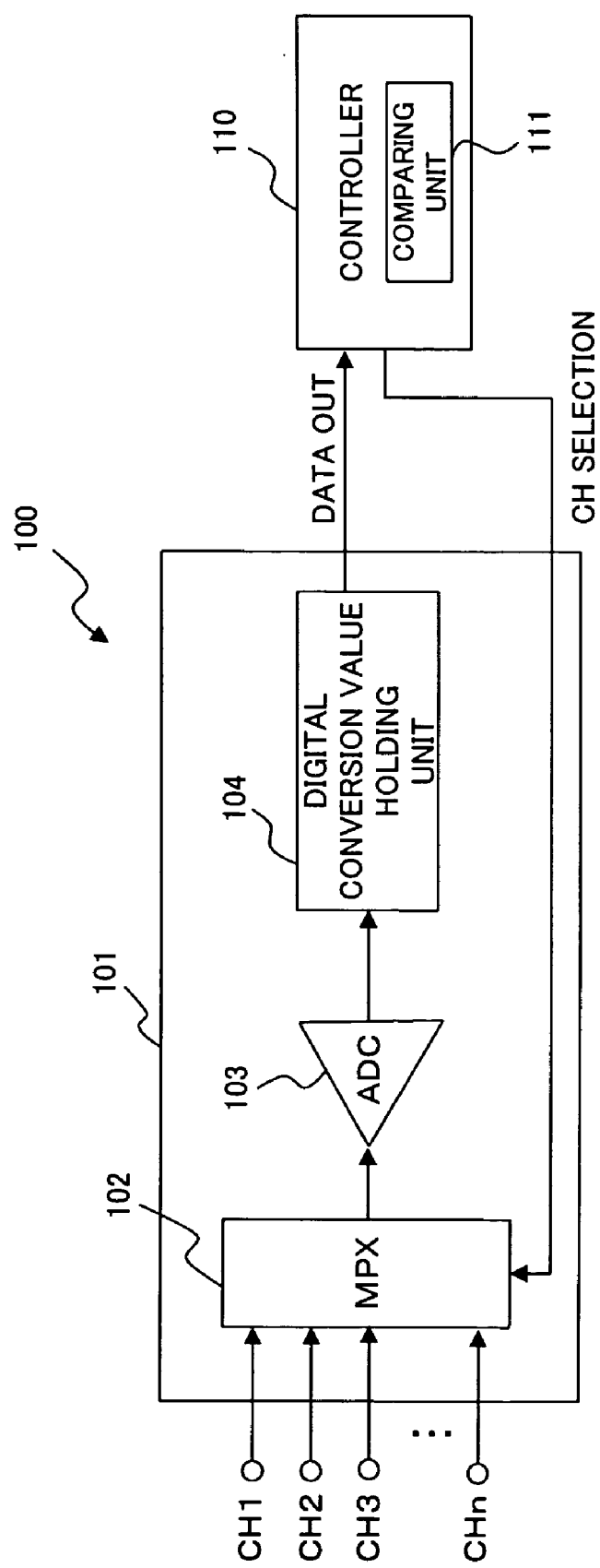
FIG. 4 is a block diagram showing a construction of a monitoring system that employs a previous A/D converting apparatus.
Figure 5:
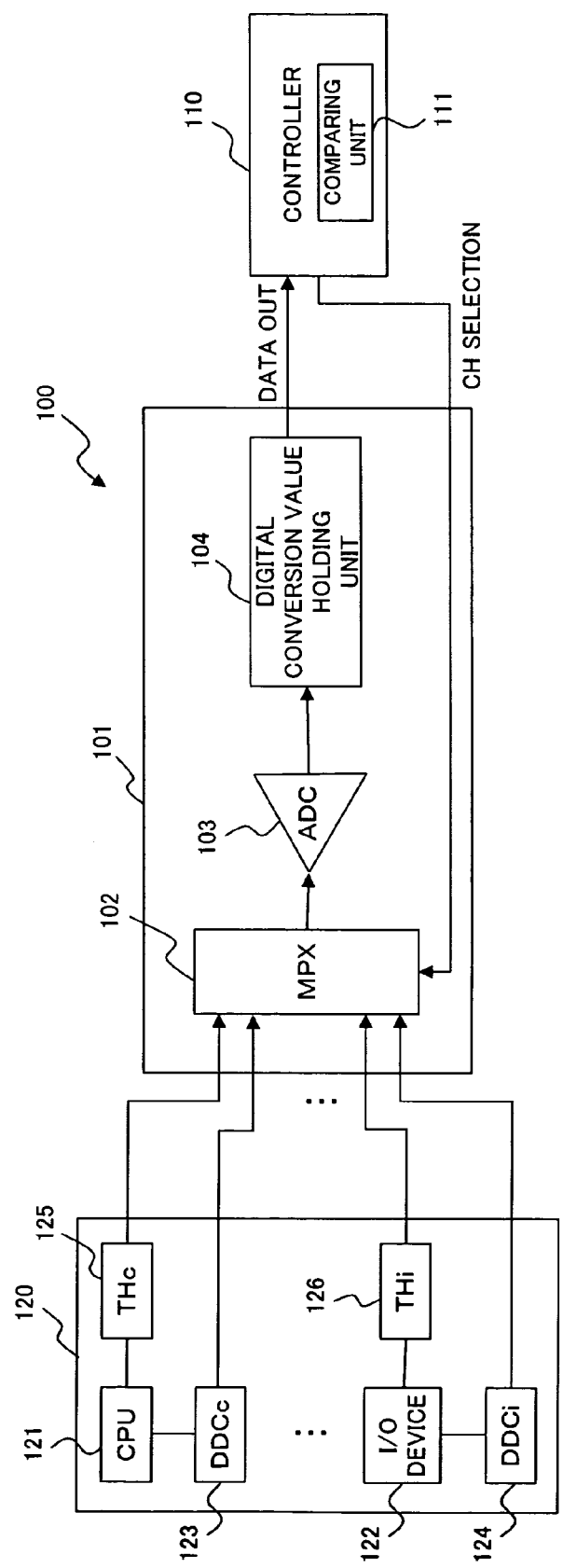
FIG. 5 is a block diagram showing an application of the monitoring system of FIG. 4.

Accordingly, in the application of the A/D converting apparatus 10 in monitoring systems such as those of FIG. 4 and FIG. 5, the following operations are performed. Upon detection of a notification signal from the notifying units 20, an external operation controller controls the MPX 16b via the first MPX control unit 17, so as to read digital data stored in the digital data holding units 16 to analyze the cause of such threshold excess.

At this time, according to the A/D converting apparatus 10 of the first embodiment, the notifying units 20 outputs a notification signal to the operation controller the moment when the digital data holding units 16 stores therein digital data of one channel that reveals threshold excess and also digital data of the remaining channels whose conversion is performed after conversion of the above channel (that is, at the time when completion of such storage is confirmed). It is thus possible for the operation controller to read all the digital data necessary for the above analysis with reliability.

In other words, the A/D converting apparatus 10 is capable of holding digital data of the one channel in which threshold excess occurs and also digital data of the remaining channels whose conversion is performed immediately after the conversion of the one channel, independently of the processing performed by the external operation controller.

Moreover, after assertion of the hold controlling signal of the digital data hold controlling unit 19, the digital data holding units 16 holds all the above digital data without updating thereof, unless a notification signal from the notifying units 20 is cleared by the operation controller. Therefore, even if the operation controller reads out the digital data from the digital data holding units 16 with delay due to any reason such as other processing, it is still possible to read out all the digital data (that is, digital data of the one channel and digital data of the remaining channels obtained immediately after the occurrence of the threshold excess of the digital data of the one channel) with reliability.

[2] Second Embodiment

Figure 3:
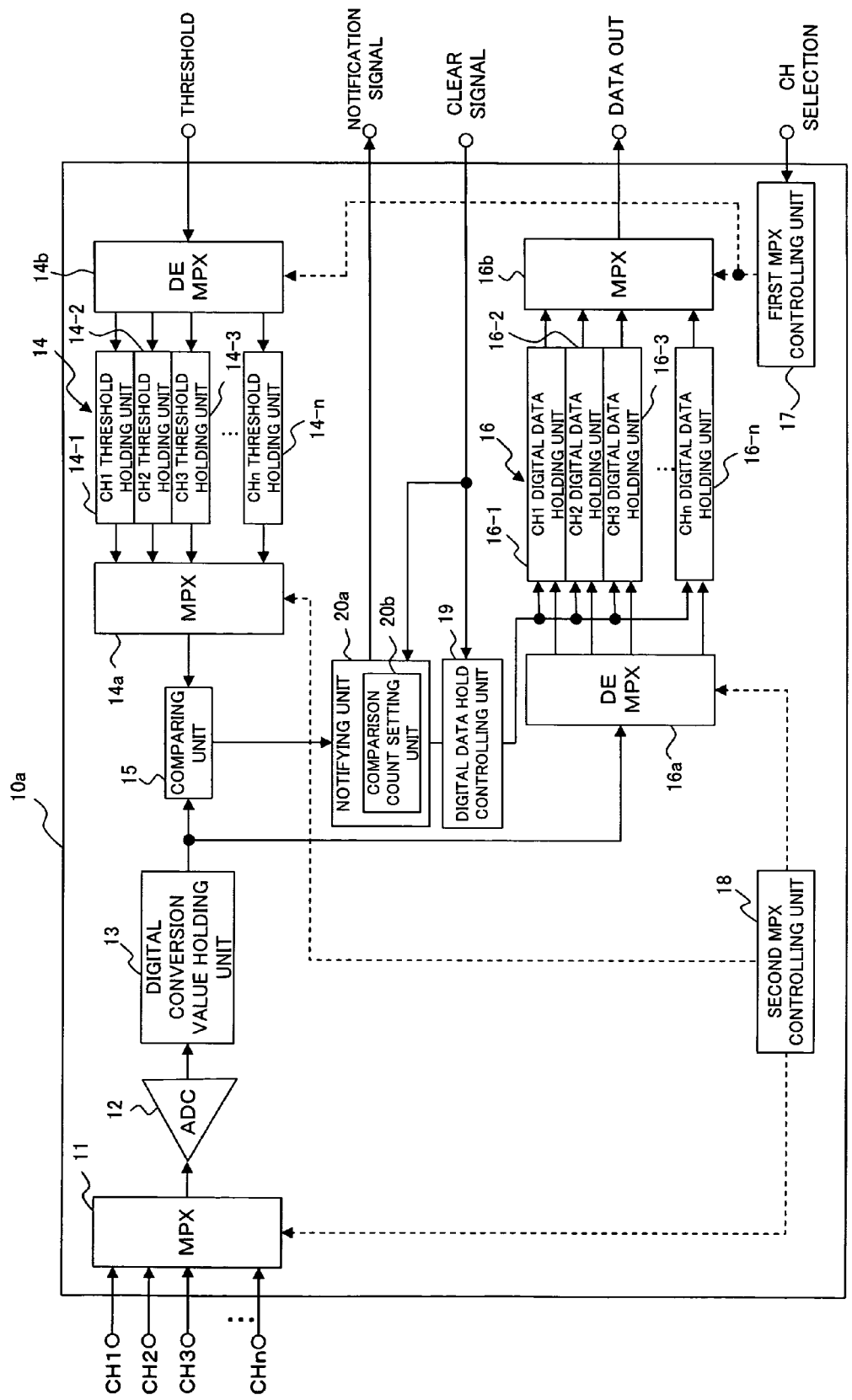
FIG. 3 is a block diagram showing a construction of an A/D converting apparatus according to a second embodiment of the present invention.

Next, a description will be made of a second embodiment of the present invention. FIG. 3 show a construction of an A/D converting apparatus of the second embodiment. Like reference numbers and characters designate similar parts or elements throughout several views of the present embodiment and the conventional art, so their detailed description is omitted here.

As shown in FIG. 3, the A/D converting apparatus 10a of the second embodiment differs from the A/D converting apparatus 10 of the first embodiment in that the notifying units 20a includes a comparison count setting units 20b. The following description will thus be concentrated on the notifying units 20a and the comparison count setting units 20b.

In the A/D converting apparatus 10a of the second embodiment, the notifying units 20a externally outputs a notification signal when the comparing units 15 consecutively detects threshold excess in digital data of one channel a predetermined number of times that is determined by the comparison count setting units 20b.

Accordingly, the digital data hold controlling unit 19 and the notifying units 20a instruct the digital data holding units 16 to operate as follows. Upon detection by the comparing units 15 that digital data of one channel consecutively exceeds its threshold a predetermined number (n) of times, which is determined by the comparison count setting units 20b, the digital data holding units 16 stores the digital data of the one channel obtained at the nth threshold excess and also digital data of the remaining channels whose conversion is performed after the nth conversion of the one channel.

After that, the notifying units 20a externally outputs a notification signal the moment when the digital data holding units 16 stores therein the digital data of the one channel obtained at the nth threshold excess and also the digital data of the remaining channels whose conversion is performed after conversion of the one channel.

As in the case of the first embodiment, after assertion of a hold controlling signal of the digital data hold controlling unit 19, the digital data holding units 16 keeps holding the following digital data without updating thereof, during the time from assertion of the hold controlling signal by the digital data hold controlling unit 19 to clearance of output of the notification signals by the notifying units 20a: the digital data of the one channel obtained at the nth threshold excess; the digital data of the remaining channels whose conversion is performed after conversion of the one channel and which is newly stored in the digital data holding units 16.

In this manner, the A/D converting apparatus 10a of the second embodiment realizes like effects and benefits to those of the first embodiment. In addition, since the notifying units 20a externally outputs a notification signal only when the comparing units 15 detects threshold excess of one channel a predetermined number of times, consecutively, it is possible to prevent erroneous detection of such threshold excess with high reliability.

[3] Other Modifications

Further, the present invention should by no units be limited to the above-illustrated embodiment, but various changes or modifications may be suggested without departing from the gist of the invention.

For example, in the above embodiments, the digital data hold controlling unit 19 negates the hold controlling signal in synchronization with the output of the notification signals by the notifying units 20 (20a). Alternatively, the negation of the hold controlling signal can be performed in response to an instruction given from an external source to clear the notification signal of the notifying units 20 (20a). In this case, the notifying units 20 no longer need to control digital data holding that is performed by the digital data holding units 16.

Further, the above descriptions are made of examples where the number (n) of channels is an integer equal to or greater than 4. However, the present invention should by no units be limited to this, as far as n is an integer equal to or greater than 2.

What is claimed is:

1. An analog/digital converting apparatus, comprising:
    an analog/digital converter which converts in sequence a plurality of channels of analog data, which is externally input to the apparatus, into a plurality of channels of digital data;
    comparing units which compares, in sequence, the individual channels of digital data obtained by said analog/digital converter to thresholds associated, one with each of the channels;
    digital data holding units which holds, if said comparing units detects that one of the channels of digital data exceeds its associated threshold, digital data of the one channel and also digital data of the remaining channels whose conversion is performed after conversion of the one channel; and
    notifying units which externally outputs a signal notifying that the digital data of the one channel exceeds its associated threshold the moment when said digital data holding units holds all the channels of digital data.

2. The analog/digital converting apparatus as set forth in claim 1, further comprising a threshold holding units which holds the threshold for each of the channels,
    said comparing units comparing the plurality of channels of digital data obtained by said analog/digital converter to the thresholds of the individual channels of digital data held in said threshold holding units.

3. The analog/digital converting apparatus as set forth in claim 1, wherein said digital data holding units holds the digital data of the one channel and also the digital data of the remaining channels until said notifying units externally receives an instruction to clear the output of the signal.

4. The analog/digital converting apparatus as set forth in claim 2, wherein said digital data holding units holds the digital data of the one channel and also the digital data of the remaining channels until said notifying units externally receives an instruction to clear the output of the signal.

5. The analog/digital converting apparatus as set forth in claim 1, wherein said digital data holding units holds the digital data for each of the channels separately.

6. The analog/digital converting apparatus as set forth in claim 2, wherein said digital data holding units holds the digital data for each of the channels separately.

7. The analog/digital converting apparatus as set forth in claim 3, wherein said digital data holding units holds the digital data for each of the channels separately.

8. The analog/digital converting apparatus as set forth in claim 4, wherein said digital data holding units holds the digital data for each of the channels separately.

9. An analog/digital converting apparatus, comprising:
    an analog/digital converter which converts in sequence a plurality of channels of analog data, which is externally input to the apparatus, into a plurality of channels of digital data;
    comparing units which compares, in sequence, the individual channels of digital data obtained by said analog/digital converter to thresholds associated, one with each of the channels;
    digital data holding units which holds, if said comparing units detects that one of the channels of digital data consecutively exceeds its associated threshold a predetermined number (n) of times, digital data of the one channel obtained by the nth conversion and also digital data of the remaining channels whose conversion is performed after the nth conversion of the one channel; and
    notifying units which externally outputs a signal notifying that the digital data of the one channel exceeds its associated threshold the moment when said digital data holding units holds all the channels of digital data.

10. The analog/digital converting apparatus as set forth in claim 9, further comprising a threshold holding units which holds the threshold for each of the channels,
    said comparing units comparing the plurality of channels of digital data obtained by said analog/digital converter to the thresholds of the individual channels of digital data held in said threshold holding units.

11. The analog/digital converting apparatus as set forth in claim 9, wherein said digital data holding units holds the digital data of the one channel and also the digital data of the remaining channels until said notifying units externally receives an instruction to clear the output of the signal.

12. The analog/digital converting apparatus as set forth in claim 10, wherein said digital data holding units holds the digital data of the one channel and also the digital data of the remaining channels until said notifying units externally receives an instruction to clear the output of the signal.

13. The analog/digital converting apparatus as set forth in claim 9, wherein said digital data holding units holds the digital data for each of the channels separately.

14. The analog/digital converting apparatus as set forth in claim 10, wherein said digital data holding units holds the digital data for each of the channels separately.

15. The analog/digital converting apparatus as set forth in claim 11, wherein said digital data holding units holds the digital data for each of the channels separately.

16. The analog/digital converting apparatus as set forth in claim 12, wherein said digital data holding units holds the digital data for each of the channels separately.

* * * * *